United States Patent [19]

Collumeau

[11] Patent Number: 4,510,677
[45] Date of Patent: Apr. 16, 1985

[54] CASES WITH FLAT TERMINAL LUGS FOR MEDIUM POWER SEMI-CONDUCTOR COMPONENTS AND A PROCESS FOR MANUFACTURING SAME

[75] Inventor: Yoland Collumeau, Paris, France
[73] Assignee: Thomson CSF, Paris, France
[21] Appl. No.: 364,207
[22] Filed: Apr. 1, 1982
[30] Foreign Application Priority Data
Apr. 8, 1981 [FR] France .................. 81 07035
[51] Int. Cl.³ .............. H01L 23/10; H01L 23/12; H01L 23/02
[52] U.S. Cl. ........................ 29/588; 29/589; 174/52 PE; 174/52 FP; 357/72; 357/69
[58] Field of Search .............. 29/588, 589, 827; 357/69, 70, 72, 80; 174/52 R, 52 PE, 52 FP

[56] References Cited

U.S. PATENT DOCUMENTS

| | | | |
|---|---|---|---|
| 3,478,420 | 11/1969 | Grimes et al. | 29/588 |
| 3,668,299 | 6/1972 | McNeal | 174/52 PE |
| 4,283,838 | 8/1981 | Yamane et al. | 29/588 |
| 4,386,463 | 7/1983 | McLaughlin | 29/827 |

FOREIGN PATENT DOCUMENTS

1161488   United Kingdom .

OTHER PUBLICATIONS

Electronic Design, vol. 28, No. 18, Sep. 1980.
R. Shinn: "Overmold Packages Firm Up TO-220 Advantages", p. 42.

Primary Examiner—Brian E. Hearn
Assistant Examiner—David A. Hey
Attorney, Agent, or Firm—Roland Plottel

[57] ABSTRACT

A case, manufactured and possibly stored in a semi-finished condition, comprising connecting lugs disposed flat after being sealed in a block of plastic material. Only then are the lugs cut out and bored if necessary, to a chosen shape and then, if need be, bent upwardly. To facilitate this bending, it is provided that the block comprises faces recessed with respect to the vertical line of the edges of a base.

5 Claims, 9 Drawing Figures

CASES WITH FLAT TERMINAL LUGS FOR MEDIUM POWER SEMI-CONDUCTOR COMPONENTS AND A PROCESS FOR MANUFACTURING SAME

BACKGROUND OF THE INVENTION

The present invention relates to cases with flat lugs for medium power semi-conductor components.

Among the different techniques for mounting power semi-conductor cases on apparatus in which they are used, there is at present a growing demand for cases with flat tags, particularly, for cases with Faston lugs, i.e. lugs each complying with pre-established standards in so far as their linear dimensions and thicknesses are concerned, and allowing rapid wiring up by means of female connectors fitting on to said lugs. But other presentations of cases with flat lugs are demanded by users for satisfying different needs for mounting in particular apparatus, more especially for series or parallel mounting.

The present invention provides a process for manufacturing a case so that, in the last manufacturing step only, a choice may be made between different modes of presentation and of conforming the connecting lugs depending on the desiderata of a particular user.

Before describing the present invention, and so as to better bring out the interest and advantages thereof, there will be described with reference to FIGS. 1 and 2 an example of a case with Faston lugs constructed with the current technique.

FIG. 1 shows in perspective a conventional flat-lug case during an intermediate manufacturing step before being sealed in a plastic material. The case comprises a base 1 made from a good heat conducting metal, for example copper coated with a metal layer adapted to facilitate soldering. This base may comprise bores 2 more particularly for providing simple fixing thereof against a heat-sink. On the base there is disposed a plate 4 of an electrically insulating material and also as good a heat conductor as possible, for example alumina metallized on both its main faces. On the electrically insulating plate 4 there is disposed a plate 5 made from a very good heat conducting material which will generally be electrically conducting, for example a copper plate coated with a material adapted to facilitate brazing. The purpose of this plate is to distribute as well as possible the heat flux to be evacuated through base 1 before it passes through plate 4. On this plate 5 are disposed one or more semi-conductor components 6 and 7 in the form of a naked chip with metal coated faces. By way of example, these components may be transistors whose face in contact with the conducting plate 5 corresponds to the collector and whose upper face comprises a base terminal and an emitter terminal. The collector terminals are then interconnected by means of metal plate 5. Lateral parts of the electrically insulating plate 4 comprise metal layers separated from the main upper metallization of this plate. On these separate metallizations are brazed the proximal part of small metal plates 10 to 13 whose distal parts are shaped in accordance with the specific Faston lug standards. Chosen terminals of each of the semi-conductor components 6 and 7 are connected by connecting wires 14 to a zone at the proximal end of the flat lugs or tags 10 to 13. FIG. 1 shows by way of example the internal wiring of a Darlington circuit in which component 6 is the driver transistor, component 7 is the output transistor, connection 11 is the base of the driver, connection 12 is the base of the output stage, connection 10 is the emitter and connection 13 is the collector.

In a subsequent manufacturing step, the result of which is illustrated in FIG. 2, lugs 10 to 13 are bent upwards orthogonally to the surface of the base and the whole is molded in a block of plastic material, for example an epoxy resin 16. The operation may be effected either by transfer molding by disposing the case or rather a series of cases in a mold of chosen shape, or else, as is more particularly shown in FIG. 2, by using a lost mold technique, i.e. by disposing a cap having an opening 17 on the base then flowing resin or other plastic material into this cap.

The case described above with reference to FIGS. 1 and 2 gives satisfactory results as conventional Faston lug case. Nevertheless, its drawback is that, after molding of the sealing plastic material, the connecting lugs cannot be simply altered or disposed in another configuration so that the user has at his disposal connecting lugs in another configuration for adapting to a particular wiring method.

SUMMARY OF THE INVENTION

To attain this object consisting in providing a flat lug case, with multiple presentations, the present invention provides a case for medium power semi-conductor components comprising a metal base on which is mounted at least one semi-conductor component, connecting lugs in the form of a small metal plates being connected to different terminals of the semi-conductor components and mounted in a plane substantially parallel to that of the base and projecting beyond both sides of this base, the assembly of the semi-conductor components and the connections being embedded in a block of insulating plastic material. This block of insulating plastic material is shaped so that, along the sides of the base where the connections project therefrom, this insulating plastic base is recessed with respect to the base at least at the positions where the connecting lugs project, which results, after formation of the block of plastic material, in the connecting lugs being able to be bent perpendicularly to the base and/or cut out in any chosen configuration. Thus, the process for manufacturing a cause such as described above comprises the steps consisting in covering with a block of plastic material the semi-conductor components and a proximal part of the connecting lugs when these latter are flat, parallel to the plane of the base and with their distal part projecting with respect to certain sides of the base, the walls of the block orthogonal to the base and parallel to said sides being recessed with respect to these sides at positions where these lugs project, then in cutting out and then shaping the lugs according to a chosen pattern. The block of resin may comprise along each of the sides where the connection project wall portions orthogonal to the base and plumb with this latter between and/or beyond the connecting lugs.

In the final step for cutting out and shaping the lugs, one of the following solutions may more particularly be adopted:

Maintaining one of the lugs on each side of the base parallel thereto, this lug having a bore therethrough for the passage of a fixing screw, the other lugs being bent back.

Cutting out each of the lugs according to pre-established standards for Faston lugs then bending them back perpendicularly to the base.

Providing the upper face of the block of insulating plastic material disposed in a plane parallel with the base with at least one recess adapted to receive an anchor nut, forming a bore in at least one of the lugs, proceeding with double bending of this lug, its distal part then being parallel to the upper face, sufficiently close to this lug to lock the anchor nut and the bore being opposite the thread of this nut.

BRIEF DESCRIPTION OF THE DRAWINGS

These objects, characteristics and advantages of the invention as well as others will be given in more detail in the following description of particular embodiments made with reference to the accompanying figures, in which.

DESCRIPTION OF THE PREFERRED EMBODIMENTS

Figure 1:
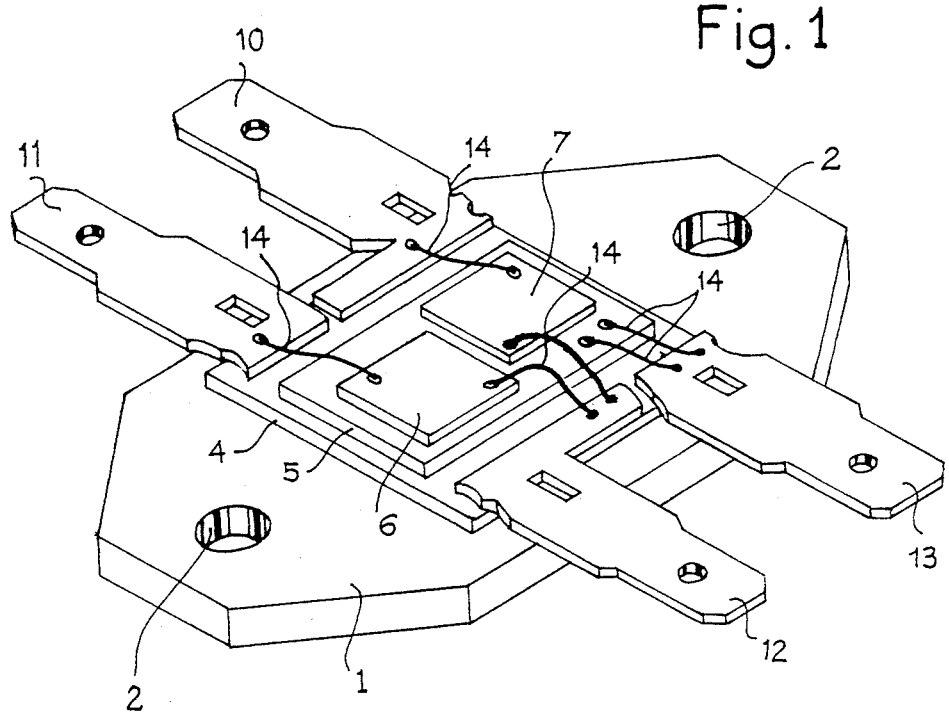
FIG. 1 shows in perspective an intermediate step for manufacturing a case with flat lugs.
Figure 3:
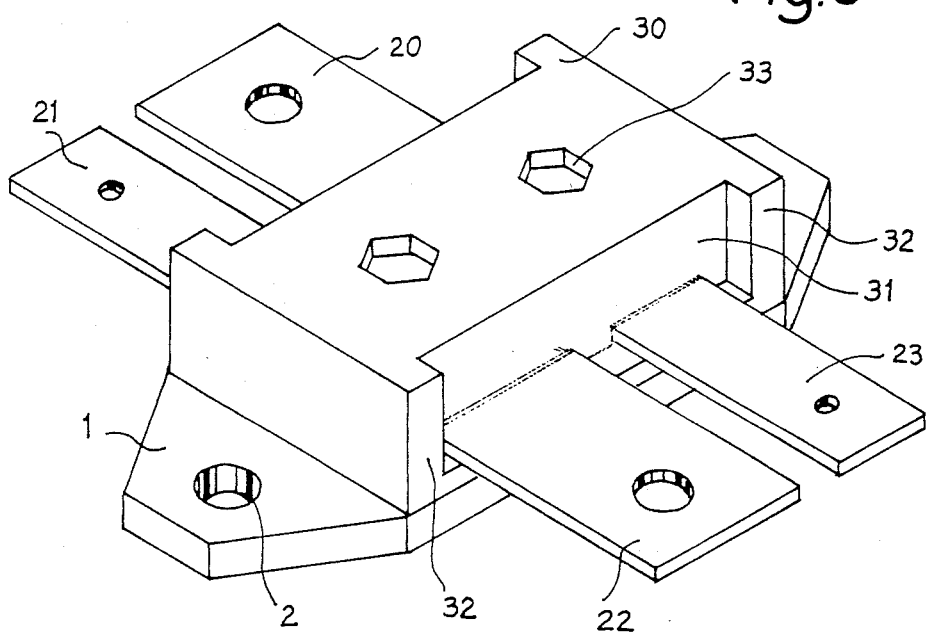
FIG. 3 shows a view in perspective of a flat lug case in accordance with the present invention.

FIG. 3 shows a perspective view of a case constructed in accordance with the invention. This case, like the one in FIG. 1, may comprise a base 1 having fixing holes 2. The internal mounting of the semi-conductor components on the base, not visible in FIG. 3, may be similar to that shown in FIG. 1. The difference between FIG. 3 and FIG. 1, for the common parts, resides essentially in the fact that the connecting lugs 20 to 23 of the case of FIG. 3 have not, during the intermediate manufacturing step of FIG. 1, any particular shape, but are conformed so as to then be able, as will be seen hereafter, to be cut out or pierced in different chosen patterns.

Figure 2:
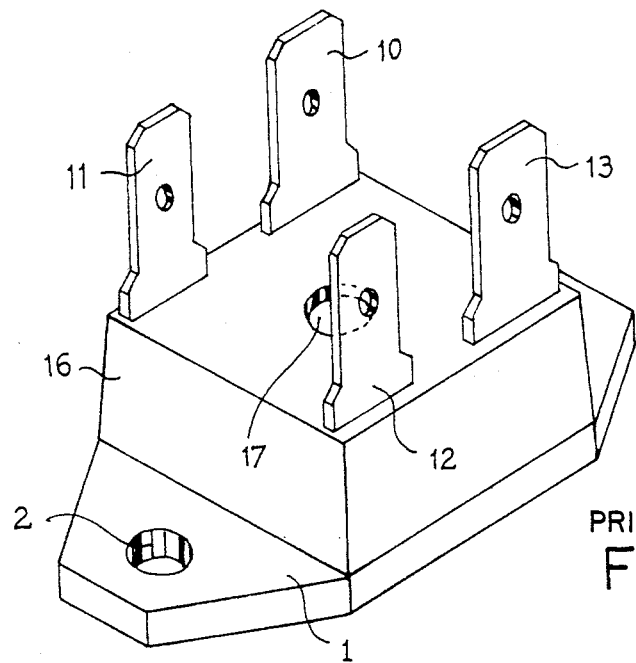
FIG. 2 shows in perspective a view of a Faston tag case of conventional configuration.

With respect to the case of the prior art, shown in FIG. 2, the case of FIG. 3 differs essentially in that the block of plastic material generally of epoxy resin, for sealing, is shaped when the connecting lugs 20 to 23 are still laid flat. The block of sealing substance 30 has faces 31 recessed with respect to the vertical (according to the representation of the figure) on the sides of the base at positions where connections 20 to 23 project. Thus, these connecting lugs may then be bent upwardly without projecting laterally outwardly of the contour of base 1. Furthermore, the block of plastic material comprises vertical projecting faces 32 plumb with the sides of the base outside the positions where the connecting lugs 20 to 23 project. Such faces have been shown in FIG. 3 at the ends of the block. A projecting face could also be provided, for example, between lugs 22 and 23. The purpose of these projecting faces is to reduce current losses and avoid possible short-circuits which could occur if a conducting bar were applied laterally against the case short-circuiting lugs 22 and 23 or 20 and 21. The upper face of the block of insulating material 30 comprises one or more recesses 33 having a shape adapted to receive nuts whose possible rotation is prevented during screwing or unscrewing.

Figure 4A:
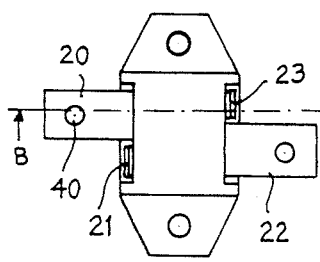
FIGS. 4A, 5A and 6A show top views and FIGS. 4B, 5B and 6B corresponding side views in section of different configurations which may be given to the connecting lugs of a case in accordance with the invention.
Figure 5A:
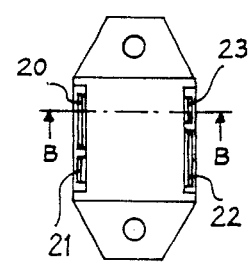
Figure 6A:
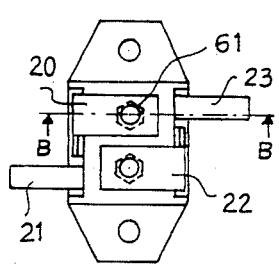
Figure 4B:
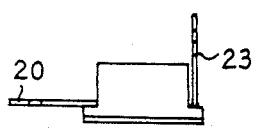
Figure 5B:
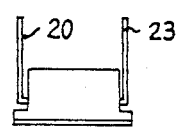
Figure 6B:
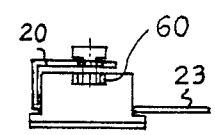

FIGS. 4 to 6 show different patterns which may be given to the connecting lugs of a case such as the one in FIG. 3, in which it is assumed that four connecting terminals 20 to 23 were provided, two of which (20 and 22) correspond to principal electrodes and the other two (21 and 23) correspond to secondary electrodes through which flow weaker currents. For example, electrodes 20 and 22 correspond to the emitter and collector terminals of a transistor or an association of transistors of the Darlington type or similar. In each case, the figure designated by the letter A is a top view and the figure designated by the letter B is a sectional view along line B of the corresponding figure marked A. In the case of FIG. 4, the principal lugs 20 and 22 are maintained flat after having been bored with a hole 40 adapted to let pass therethrough a fixing screw. The control lugs 20 and 23 are bent, for example as shown in FIG. 4B. This mounting is well adapted to connecting together, in parallel between bars, several identical components, all the lugs 20 of an assembly of cases being connected to a first bar and all the lugs 22 of this assembly of cases being connected to a second bar. In such an assembly, the terminals 21 on the one hand and terminals 23 on the other may be connected together, either by means of other bars, or by wiring effected with Faston connectors. In the case envisaged, lugs 21 and 23 will have been either bored with holes, or cut out according to standards for the Faston lugs before being bent.

In the case of FIG. 5, all the lugs have been cut out according to the standards of Faston lugs then bent upwardly to provide a case having the same use as the case of FIG. 2 described and shown previously.

In the case of FIG. 6, a nut 60 is inserted into each of the blind holes 33. The main lugs are cut out and provided with a bore 61 so as to be able to be bent twice in the way illustrated and to come back on to the upper wall of the case, thus imprisoning nut 60, bore 61 being opposite the threaded hole of this nut. This embodiment also allows simple associations by means of sets of bars in series or in parallel of several cases such as shown. In the case illustrated, the control lugs 21 and 22 are left flat but they may be given any other conformation depending on the mounting provided for the case.

Thus, the present invention allows standard cases to be manufactured such as shown in FIG. 3, and then only, possibly after storage, the connecting lugs to be given a conformation chosen according to the requirements of a user. This simplifies the storage problems and provides a single manufacturing method for different uses.

Of course, the present invention is susceptible of numerous variations. For example, the base 1 has been shown as having trapezoidal extensions outside the zone covered by the sealing material. This base may well be rectangular and limited to the covered zone of a sealed casing or have any other chosen shape. The internal part of the case may be other than shown in FIG. 1. By way of example, the conducting plate 5 may be replaced by two plates brazed to two electrically insulated areas on the insulating plate 4. The case may then contain two components, for example two diodes, which would be completely insulated from each other. Or, on the contrary, the semi-conductor components may be directly soldered to the case without placing an insulating substance 4 therebetween.

In accordance with the current practice in the field of semi-conductor manufacture, plates 20 to 23 are not in fact fixed separately one after the other on base 1 (by means of an insulating piece); on the contrary, during a simultaneous operation, a large number of soldering operations are effected on several cases during manufacture, the connecting plates being secured to one another according to a "connection grid". The different plates are secured together, gaps being provided only at the places where they are to be separated. Thus, the cutting out step, for example by stamping, of the plates for giving to each one a chosen shape and providing it with bores of given dimensions does not form an additional step with respect to the conventional steps for manufacturing the case since, in any case, this stamping step must be provided for separating each of the connecting tags or lugs from the "connection grid".

What is claimed is:

1. A process for manufacturing a case for encapsulating power semiconductor components, said case including a metal base having two parallel sides, at least one semiconductor component mounted on said base, said component having connecting lugs in the form of small metal plates projecting beyond the edges of said parallel sides of the base, said process comprising the following steps:
   molding plastic material onto the metal base allowing said plastic material to surround and encapsulate the semiconductor components and a proximal part of each lug, so as to form a block of plastic material having lateral walls from which protrudes a flat distal part of each lug, said block totally surrounding the lugs at the places where they protrude therefrom, said lateral walls of said block each having a lower portion below the lugs and an upper portion above the lugs, said lower portion being formed normal to the metal base and flush with said parallel sides of the metal base between the metal base and the lugs, said upper portion being recessed with respect to the edges of said metal base, said recess extending the entire height of the lateral walls above the lugs, and
   cutting and shaping said lugs in accordance with a chosen pattern subsequent to molding said block.

2. The process as claimed in claim 1, wherein the step of molding said block of plastic material includes forming portions of said block along each of its side walls orthogonal to said base and flush with the edges thereof.

3. The process as claimed in claim 1, further comprising the step of maintaining one of said lugs on each side of said block parallel to said base, forming a bore in said lug adapted to let a fixing screw pass therethrough, and bending said other lugs in a direction along said recess.

4. The process as claimed in claim 1, wherein the step of cutting said lugs is performed in accordance with a standard established for Faston lugs and bending said lugs perpendicular to the base in a direction along said recess.

5. The process as claimed in claim 1, further comprising the steps of forming at least one recess in the upper face of the block of plastic material which is parallel to the base, said recess adapted to receive an anchor nut, bending at least one of said lugs twice successively so that the distal part of this lug is oriented parallel to said upper face, sufficiently close to said upper face to permit fastening said lug to said upper face, and forming a bore through said lug, said bore positioned so that it is opposite said recess in said upper face to permit a screw to pass through said bore for threading into said anchor nut.

* * * * *